(12) United States Patent
Pfeiffer et al.

(10) Patent No.: US 10,907,244 B2
(45) Date of Patent: Feb. 2, 2021

(54) PRODUCTION OF NANOSTRUCTURED MATERIALS

(71) Applicant: VSPARTICLE HOLDING B.V., Delft (NL)

(72) Inventors: Tobias Vincent Pfeiffer, Delft (NL); Aaike Willem Van Vugt, Delft (NL); Andreas Schmidt-Ott, Delft (NL)

(73) Assignee: VSPARTICLE HOLDING B.V., Delft (NL)

(*) Notice: Subject to any disclaimer, the term of this patent is extended or adjusted under 35 U.S.C. 154(b) by 163 days.

(21) Appl. No.: 15/527,902

(22) PCT Filed: Nov. 20, 2015

(86) PCT No.: PCT/NL2015/050814
§ 371 (c)(1),
(2) Date: May 18, 2017

(87) PCT Pub. No.: WO2016/080837
PCT Pub. Date: May 26, 2016

(65) Prior Publication Data
US 2018/0347026 A1  Dec. 6, 2018

(30) Foreign Application Priority Data
Nov. 20, 2014  (NL) .................................... 2013836

(51) Int. Cl.
*C23C 14/04* (2006.01)
*C23C 14/22* (2006.01)

(52) U.S. Cl.
CPC .......... *C23C 14/046* (2013.01); *C23C 14/228* (2013.01)

(58) Field of Classification Search
None
See application file for complete search history.

(56) References Cited

U.S. PATENT DOCUMENTS

2005/0255242 A1\* 11/2005 Hass ..................... C23C 14/04
427/248.1
2008/0264259 A1  10/2008 Leung
(Continued)

FOREIGN PATENT DOCUMENTS

| CN | 101534941 | 9/2009 |
| WO | WO2008063880 | 5/2008 |
| WO | 2013115644 A1 | 8/2013 |

OTHER PUBLICATIONS

Pfeiffer et al.; New Developments in Spark Production of Nanoparticles; Advanced Powder Technology; 25 (2014) 56-70; Oct. 2013.\*
(Continued)

*Primary Examiner* — Michael R. Rodriguez
(74) *Attorney, Agent, or Firm* — Lucus & Mercanti, LLP

(57) ABSTRACT

The invention relates to a method for the production of materials. In particular the invention relates to nanostructured materials, and an apparatus and method for the production thereof. In accordance with the invention nanostructured materials are produced by the subsequent steps of producing nanoparticles; transporting the nanoparticles into, and optionally through, a porous carrier by a gas flow; and depositing the nanoparticles onto the surface of said porous carrier in an essentially isotropic manner.

20 Claims, 5 Drawing Sheets

(56) References Cited

U.S. PATENT DOCUMENTS

2008/0274344 A1* 11/2008 Vieth .................. B01J 23/42
  428/304.4
2013/0045155 A1    2/2013 Brey et al.

OTHER PUBLICATIONS

Shastry, R. et al, "Parameters affecting deposition of multi walled carbon nanotubes on a continuously fed substrate using arc discharge", International Conference on Nanoscience and Nanotechnology, 2006, pp. 107-111.

Pfeiffer et al. "New developments in spark production of nanoparticles", Advanced Powder Technology, 2014, vol. 25, No. 1, pp. 56-70.

International Search Report and Written Opinion for International Application No. PCT/NL2015/050814 (dated Mar. 10, 2016) (9 Pages).

Mei, "Microcarrier Drug Delivery System", Huazhong University of Science & Technology Press, 2009, pp. 102-103.

\* cited by examiner

PRODUCTION OF NANOSTRUCTURED MATERIALS

CROSS-REFERENCE TO RELATED APPLICATIONS

This application is a 371 of PCT/NL2015/050814, filed Nov. 20, 2015, which claims the benefit of Netherlands Patent Application No. 2013836, filed Nov. 20, 2014.

FIELD OF THE INVENTION

The invention relates to a method for the production of materials. In particular the invention relates to nanostructured materials, and an apparatus and method for the production thereof.

BACKGROUND OF THE INVENTION

Nanostructured materials find important applications in society. They may for instance be present in catalysts, filters, sensing devices and electronics. In general, it is important that the structures of these materials are well defined. This requires methods and apparatuses that enable the production of the nanostructured materials in a well-controlled manner, preferably down to the nanoscale.

SUMMARY OF THE INVENTION

It is an object of the present invention to provide a versatile method for the production of nanostructured materials by depositing nanoparticles onto a porous carrier in an essentially isotropic manner. An essentially isotropic manner in the context of the present invention is a manner that results in deposition of particles on the surfaces of the carrier facing the gas flow ("external side") as well as on the surfaces not facing the flow ("internal side"). Hence, on the scale of the pore size of the porous carrier, the nanoparticles are evenly distributed throughout the porous carrier on both external and internal surfaces. The internal surface is the part of the total surface of the porous carrier that is not in the "line-of-sight" from the source or the side from where the nanoparticles are produced. Of course, between source and deposition the duct may be curved, so line-of-sight is not to be understood in the optical sense.

Methods known to date for the production of nanoscaled materials typically involve the controlled growing of matter onto carriers. A typical example of such technologies is physical vapor deposition (PVD). However, these technologies are generally restricted to the controlled growing of matter, e.g. nanoparticles, onto the external surfaces of carriers and as such limited to non-porous-carriers, e.g. flat surface carriers. In the case porous carriers are used, the deposition of the matter does not occur in an essentially isotropic manner as the penetration of the matter into the porous carrier is limited.

For instance, US-A-2013/0045155 discloses the deposition of gold nanoparticles onto nanoporous materials by using the PVD method. It is described that penetration of the gold nanoparticles is limited to about 90 nm in depth and the major part of the carrier's surface is not covered by the gold nanoparticles, so an anisotropic deposition is obtained. Hence, no essentially isotropic deposition is achieved.

US-A-2005/255242 describes the generation and deposition of atomic or molecular vapor onto a substrate. A smooth layer of deposited vapor and no nanostructured material is obtained.

Alternative methods for the deposition of matter onto porous carriers include impregnation with nanoparticle-comprising liquids. However, these methods do not result in the required control for the production of nanostructured materials with a desired morphology.

The present inventors have surprisingly found a method that enables the production of nanostructured materials comprising nanoparticles that are essentially isotropically deposited onto a porous carrier. Thus, the present invention is directed at a method for producing nanostructured materials comprising the step of:

a) producing nanoparticles;
b) transporting the nanoparticles into, and optionally through, a porous carrier by a gas flow;
c) depositing the nanoparticles onto the surface of said porous carrier in an essentially isotropic manner.

DETAILED DESCRIPTION OF THE INVENTION

Figure 1:
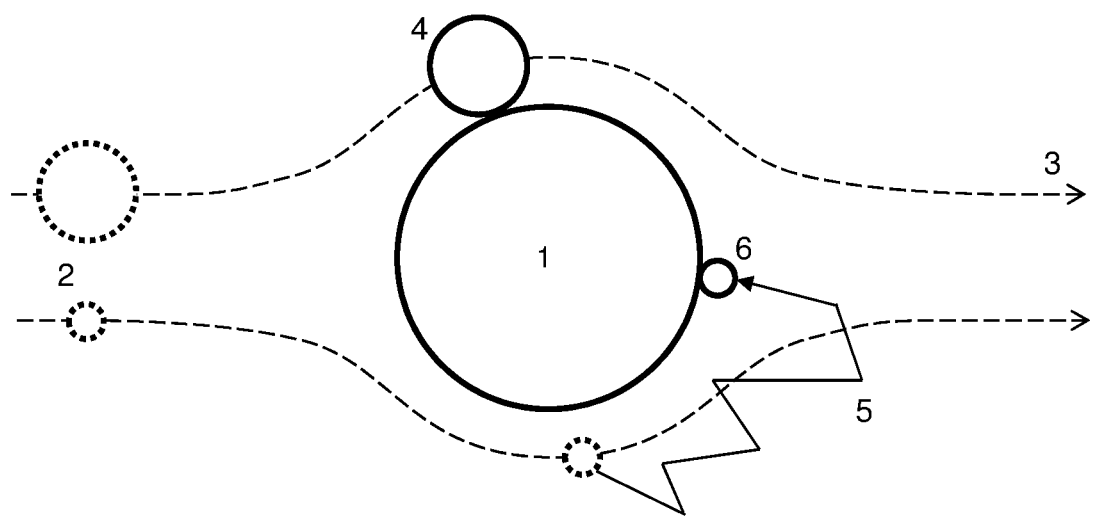
FIG. 1 is a schematic representation of the pathway of deposited nanoparticles in accordance with the present invention.

The inventors found that the production of the nanoparticles can be very well controlled. This means that a desired concentration of nanoparticles with a desired size and shape can be produced. This is beneficial to obtain the essentially isotropic distribution of the nanoparticles in the porous carrier.

With essentially isotropic is meant herein that, on the scale of the pore size of the porous carrier, the nanoparticles are evenly distributed on the external and internal surfaces of the porous carrier. The term essentially indicates that the amount of deposited nanoparticles may be different at the internal surface compared to the external surface but that, on the scale of the pore size of the porous carrier, the thickness of the layers of deposited nanoparticles on the internal and external surfaces are the same.

The even distribution of the nanoparticles on the scale of the pore size means that a varying distribution at larger scale (e.g. centimeter scale) may be possible. For instance, due to the decrease of available nanoparticles that can be deposited on surface throughout the porous carrier, the amount of nanoparticles deposited deeper into the porous carrier—when viewed from the flow of the nanoparticles—may be less than at the beginning of the porous carrier. As such, the amount of deposited nanoparticles deeper into the carrier may be less than at the beginning of the carrier, and at this large scale an even distribution is thus not required.

The scale of the pore size of the porous carrier depends on the porous carrier that is selected for the present invention. Typical pore sizes are in the range of 1 to 1000 μm.

Nanostructured herein means a structure wherein individual particles of 1-100 nm, preferably 3-30 nm, can be distinguished. As such, on the scale of the pore size of the porous carrier (or smaller), a rough surface can be observed that is typically structured like a fractal. This fractal-like structure on this scale is in strong contrast to the smooth surfaces that are obtained by e.g. physical vapor deposition.

In accordance with the present invention preferably a spark ablation device is used for the production of the nanoparticles and the nanostructured materials according to the present invention.

Spark ablation is a physical phenomenon whereby a spark between two electrodes is generated, leading to local ablation of the electrodes. By this ablation, a vapor of the matter comprised by the electrodes is obtained, which is subsequently rapidly cooled. This vapor initially comprises mainly single atoms, which collide and grow in time to larger particles comprising multiple atoms, in a process described as coagulation. The size to which particles grow by this mechanism depends mostly on the initial vapor concentration and the time allowed for growth. By approximation, the mean particle mass in at a certain time can be calculated by dividing the initial vapor mass concentration C by the particle number concentration N at time t. From coagulation theory, which is assumed to apply to the present invention, it follows that the particle number concentration essentially decreases proportional to 1/t, so that m=C/N, which is proportional to C×t. By working with short process times, small particle masses, and thus small particle sizes, can be obtained, while keeping the concentration high. High particle concentrations result in larger production rates, and a faster, more efficient deposition process.

The inventors found that in order to deposit the nanoparticles in an essentially isotropic manner, the particles should be highly diffusive. For particles smaller than the mean free path, the diffusion coefficient is proportional to the inverse of the square of the particle size, i.e. smaller particles are significantly more diffusive. For an essentially isotropic distribution, the size of the nanoparticle is preferably less than the mean free path of a molecule of the gas flow, more preferably the size of the nanoparticle is less than 20 nm, most preferably less than 10 nm. The mean free path is the mean length of a path covered by a gas molecule of the carrier gas between subsequent impacts with other molecules. The mean free path is dependent on the mass of the molecules, the pressure and temperature. For instance, the mean free path of an air molecule at ambient temperature and pressure is 68 nm.

It is preferred for the present invention that the nanoparticles are generated and deposited at a pressure of 1 to 2 atmosphere, more preferably at atmospheric pressure. As such, no vacuum installation is required allowing a more convenient method for the preparation of the nanostructured materials.

Hence, following the coagulation theory described above, nanoparticles can be prevented from growing too large by using low concentrations of depositing nanoparticles. However, the rate of deposition of the nanoparticles onto the porous carrier is proportional to the concentration of the depositing nanoparticles. Hence, a low concentration of nanoparticles results in slow deposition thereof onto the porous carrier and thus in time consuming methods. Therefore, it is preferred to avoid low concentrations of the nanoparticles.

If the process time is kept short enough, high particle concentrations can be combined with particle sizes sufficiently small for essentially isotropic deposition. Hence, the time between when the initial cloud of material or vapor is formed and when the particles are deposited is preferably minimized. In a preferred embodiment of the present invention, the nanoparticles are deposited in a time of less than 1000 ms, preferably less than 100 ms, more preferably less than 75 ms, typically 10-50 ms after the production of the nanoparticles. Such short times allow high concentration of the nanoparticles, while sufficiently limiting particle growth to ensure efficient deposition.

It was found that by using a spark ablation device the size and concentration of the depositing particles can be controlled while maintaining such short deposition times. Because the volume of the initial vapor cloud may be small, the particles can be effectively transported to the deposition area. The transport time can be short, so that the nanoparticles grow no larger than the desired size. Additionally, the residence time distribution is narrow, i.e. each depositing particle has a similar growth history, resulting in excellent control of particle size. A spark ablation device which may be particularly suitable for the present invention is described in WO-A-2013/115644, which is incorporated herein in its entirety.

The size of nanoparticles may be controlled by the specific use of the spark ablation device and the gas flow. In particular, the desired size of the nanoparticle may be set on the one hand by varying spark energy (J), and spark-frequency (sparks/s), determining the production rate, and on the other hand by gas flow rate ($dm^3/s$), or by a combination of these parameters (Pfeiffer et al. "New Developments in Spark Production of Nanoparticles." Advanced Powder Technology 25(2014) 56-70). The spark energy (typically 0.1 mJ-1 J), spark-frequency (typically 50-50.000 spark/s) and gas flow rate (typically 0.01-10 $dm^3/s$) may also be parameters used to control the concentration of nanoparticles. These parameters may be used independently to control the concentration of nanoparticles. Typically, the concentration of nanoparticles is precisely controlled by changing both the spark energy and the spark frequency or by changing all three parameters.

Preferably, the gas flow is chosen small enough to avoid damage to the porous carrier. Using low pressure drop porous substrates limits the force exerted by the flowing gas on the porous carrier, allowing the use of greater gas flows and thus shorter residence times. Preferably, the mean face velocity through the porous medium is about 0.1 to 5 m/s.

The use of a spark ablation device is particularly advantageous over methods for the production of nanoparticles that rely on heating the gas stream. The rapid cooling in the spark enables fast deposition of the particles on the porous structure at low temperature, typically room temperature, which is much lower than the temperature at which the vapor is formed. The fast deposition achievable with the present invention (a short residence time) limits particle growth by coagulation, allowing nanoparticles to be deposited at high production rates and at feasible gas flow rates. Most alternative methods for the production of nanoparticles cause substantial heating of the gas stream, so that a fast deposition results in melting of deposited nanoparticles which in turn may result in a smooth layer of the deposited nanoparticles. A smooth layer may be unfavorable in applications of the nanostructured material since the surface area of the layer is lower when it is smooth. For instance, if the application is catalysis, a large surface area is usually advantageous for catalytic activity. If the application is sensing, a large surface area may be advantageous for a high sensitivity of the sensor. High temperatures may also damage the porous carrier. Hence, a low temperature downstream of the production of the nanoparticles is advantageous to obtain an open structure of the nanostructured materials. Therefore, in a preferred embodiment of the present invention, the temperature of the gas flow at the point of deposition is lower than 200° C., preferably lower than 100° C., most preferably lower than 50° C., even more preferably between 10 and 30° C., typically about room temperature (25° C.).

The materials of which the nanoparticle may be composed, may be controlled by selecting electrodes comprising the corresponding materials. Hence, for producing a nanoparticle comprising gold, an electrode comprising gold may be selected for the spark ablation device. A spark ablation device requires two or more electrodes. By selecting electrodes comprising different materials, nanoparticles may thus be produced comprising a variety of materials. For instance, if nanoparticles comprising gold and nanoparticles comprising aluminum would be required, an electrode comprising gold and an electrode comprising aluminum could be selected for use in the spark ablation device. Hence, in a preferred embodiment of the present invention, the material comprised by the nanoparticles, may be selected by selecting appropriate electrodes for the spark ablation device. This enables precise control on the material comprised by the nanostructured materials produced by the present invention. Hence, nanostructured materials comprising a layer of nanoparticles that comprises two or more materials may also be obtained by the present invention. One material may form the carrier material of a catalyst and the other material may be the active catalyst.

Chemically modified nanoparticles may be obtained by reacting the particles with a gas, e.g. oxygen, before or after deposition. Coated nanoparticles may be obtained by adding nanoparticles to the gas flow entering the inlet into the reactor.

For a typical spark ablation device comprising two electrodes, the amount of nanoparticles produced from each electrode are not identical. Typically, the amount of nanoparticles are produced in a 3:1 ratio from each electrode. This may depend on the relative position of the electrodes to the direction of the electrical current, as well as on material properties of the respective electrodes. Hence, the relative position of the electrodes may also be of influence for the composition of the layer of deposited nanoparticles. This may be of particular influence in case the electrodes each comprise different matter.

In another embodiment of the present invention, the used electrode may be switched or substituted by another electrode during the process. This enables additional control of the structure of the nanostructured materials. By switching to an electrode comprising a different material, the nanostructured material produced may comprise layers of different materials. The thickness of each layer (i.e. the amount of deposited nanoparticles) may be controlled by the duration of the production of the nanoparticles with the corresponding electrode.

WO-A-2013/115644 also describes how big droplets of materials may be avoided by using magnetic fields. This may also be advantageous for the present invention. The use of one or more hollow electrodes may also be preferred. Hollow electrodes may reduce the residence time of the nanoparticles in the spark ablation device. As a consequence, the time between the production of the nanoparticles and the deposition of these onto the porous carrier may be reduced by using a spark ablation device comprising hollow electrodes. In particular, said time may be reduced by directing the gas flow through the hollow electrode or hollow electrodes.

The nanoparticles are deposited onto a porous carrier. The porous carrier may comprise any type of material. Typical materials may be metal, ceramics or organic polymers such as polyvinyl alcohol or carbon nanotubes. Combinations of different materials may also be possible.

Preferably, the porous carrier is a nanoporous carrier, preferably comprising nanofibers or nanowires.

In the particular embodiment that the porous carrier comprises nanowires, the thickness of the nanowires is preferably less than 1000 nm, more preferably less than 250 nm. Typically, the thickness of the nanowires is in the order of or less than about the mean free path of a molecule of the flow gas. In a preferred embodiment, the thickness of the nanowire is between 70 and 200 nm. Nanowires of these particular dimensions are particularly advantageous for a low pressure drop when the nanoparticles are transported into the porous carrier by the gas flow. For fibers of this thickness the efficiency of deposition by means of diffusion for particles smaller than about 20 nm is 5-1000 times greater than unity, i.e. the fibers collect nanoparticles from an area greatly exceeding the projected area of said fiber. If the nanowires are too thick, said transportation of the nanoparticles would be inhibited and thereby the deposition of the nanoparticles may not be in an essentially isotropic manner. For this reason, the void between said nanowires may also be sufficiently large in order to avoid a large pressure drop of the gas flow. With thinner wires a lower volume fraction of carrier material can be achieved, resulting in very high relative concentrations of deposited nanoparticles in the nanostructured material.

The porous carrier according to the present invention may be prepared by electrospinning polymers onto a clean mesh structure that adds mechanical strength.

The inventors found that by small dimensions of the nanoparticles and the porous carrier, the deposition of the nanoparticles is particularly essentially isotropic. This may be effected by diffusion of the nanoparticles. Therefore, in a particular embodiment of the present invention, the nanoparticles are deposited onto the porous carrier in an essentially isotropic manner by diffusion of the nanoparticles. In the context of the present invention, diffusion of the nanoparticles means that the nanoparticles are partially passively dispersed throughout the porous carrier. Hence, although the nanoparticles are actively transported into the porous carrier by the gas flow, advantageously the nanoparticles also move by means of diffusion to deposit onto the porous carrier. If the nanoparticles are sufficiently small, diffusion is dominant with respect to other transport mechanisms, in particular those based on particle inertia. Without wishing to be bound by theory, the inventors believe that this may be caused by the Brownian motion of the nanoparticles.

Figure 2:
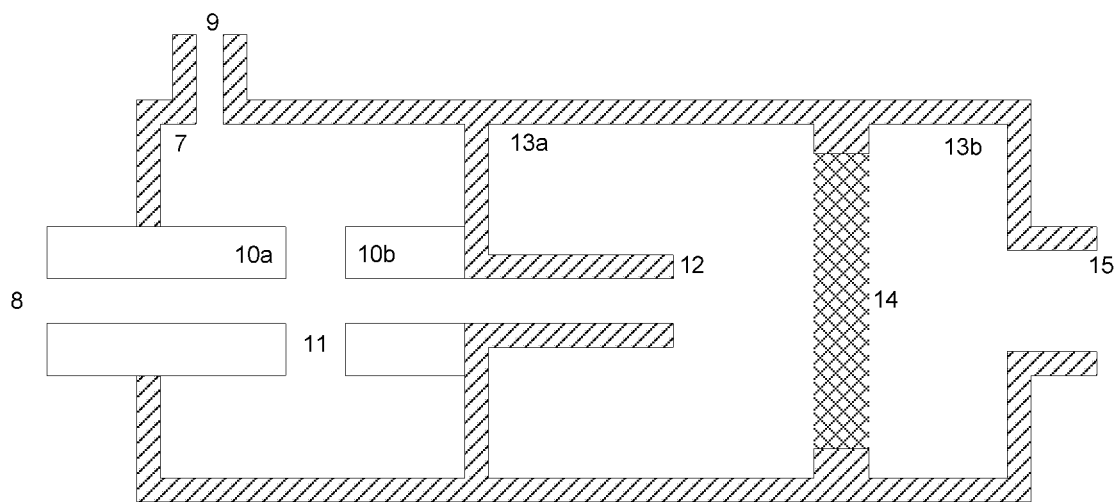
FIG. 2 is a schematic representation of an apparatus which may be used in a particular embodiment of the present invention.

FIG. 1 depicts the cross-section of a single fiber (1) suspended perpendicularly to a flow of gas. Shown are the initial positions (2) of a large and a small particle on their respective streamlines (3). The diffusivity of the large particle is negligible, and it follows the streamlines until it is deposited on the external surface of the fiber by interception (4), often aided by inertial forces. The small particle has a significant diffusivity, and after a random walk (5) is deposited isotropically onto the fiber (6). Although a single fiber is depicted, the same processes are applicable to a structured or random network of multiple fibers. It will be appreciated that the isotropic deposition also applies to surfaces placed downstream, i.e. in the shadow of external fibers. A preferred configuration of an apparatus for the essentially isotropic deposition of nanoparticles is provided in FIG. 2. It may comprise an ablation chamber (7) equipped with one or two gas inlets (8,9), and one or more pairs of axially aligned electrodes (10a, 10b). Each of the electrodes (10a, 10b) may comprise at least one conducting or semiconducting material. Electrode 10a is optionally a solid rod, and optionally of the same composition as electrode 10b. One or both electrodes may be placed at high potential. The vapor cloud ablated by each spark may be transported from the ablation zone (11) through a nozzle (12) into the deposition chamber (13a, 13b). Preferably, the walls of the chambers (7, 13a, 13b) and the nozzle are made of a conductive material, and are typically kept at ground potential. The porous carrier (14) may be supported such that the gas flow is forced to flow through the carrier from section (13a) to (13b). After passing through the porous carrier (14), the gas may exit through exhaust port (15). The residence time of the gas can be calculated by dividing the volume ($dm^3$) separating the ablation zone (11) and the porous carrier (14), i.e. the sum of the inner volumes of sections 10b, 12 and 13a, by the volumetric flow rate ($dm^3/s$).

If appropriate material for the porous carrier is selected, the porous carrier may be removed after deposition of the nanoparticles. For instance, in case the porous carrier is composed of organic materials, it may be oxidized such that only the layer of deposited nanoparticles remains.

A further aspect of the present invention is directed to nanostructured materials. In particular to nanostructured material comprising a porous carrier and an essentially isotropic layer of deposited nanoparticles on said porous carrier.

A particular embodiment of the present invention is a nanostructured material comprising a porous carrier and an essentially isotropic layer of deposited nanoparticles on said porous carrier, wherein the layer of nanoparticles has a thickness between 0.01 µm and 10 µm, preferably between 0.1 µm and 7 µm, more preferably between 0.7 µm and 5 µm, most preferably between 1 µm and 3 µm. Typically, the deposited layer has a total thickness significantly thicker than the smallest dimension of the porous carrier (e.g. thickness of the wire). Due to the rough surface or fractal-like structure of the nanostructured material, the thickness of the deposited layer can vary significantly on a nanoscale, see for instance the figures. The thickness of the deposited layer is therefore ideally determined at a micrometer scale.

The nanostructured material according to the present invention may be used in catalysis, sensing, detecting, filters, electrical devices and the like.

A poster entitled "A new, clean and flexible method of catalyst synthesis" which was presented by two of the present inventors at The Netherlands' Catalysis and Chemistry Conference XV at 10 Mar. 2014, disclosed that deposition of spark produced nanoparticles on top of electrospun nanofibers is highly efficient. Transportation into a porous carrier and depositing the nanoparticles throughout the porous carrier in an essentially isotropic manner according to the present invention has not been disclosed.

For the purpose of clarity and a concise description, features are described herein as part of the same or separate embodiments. However, it will be appreciated that the scope of the invention may include embodiments having combinations of all or some of the features described.

The invention is further illustrated by the following experimental examples.

Example 1

Figure 3:
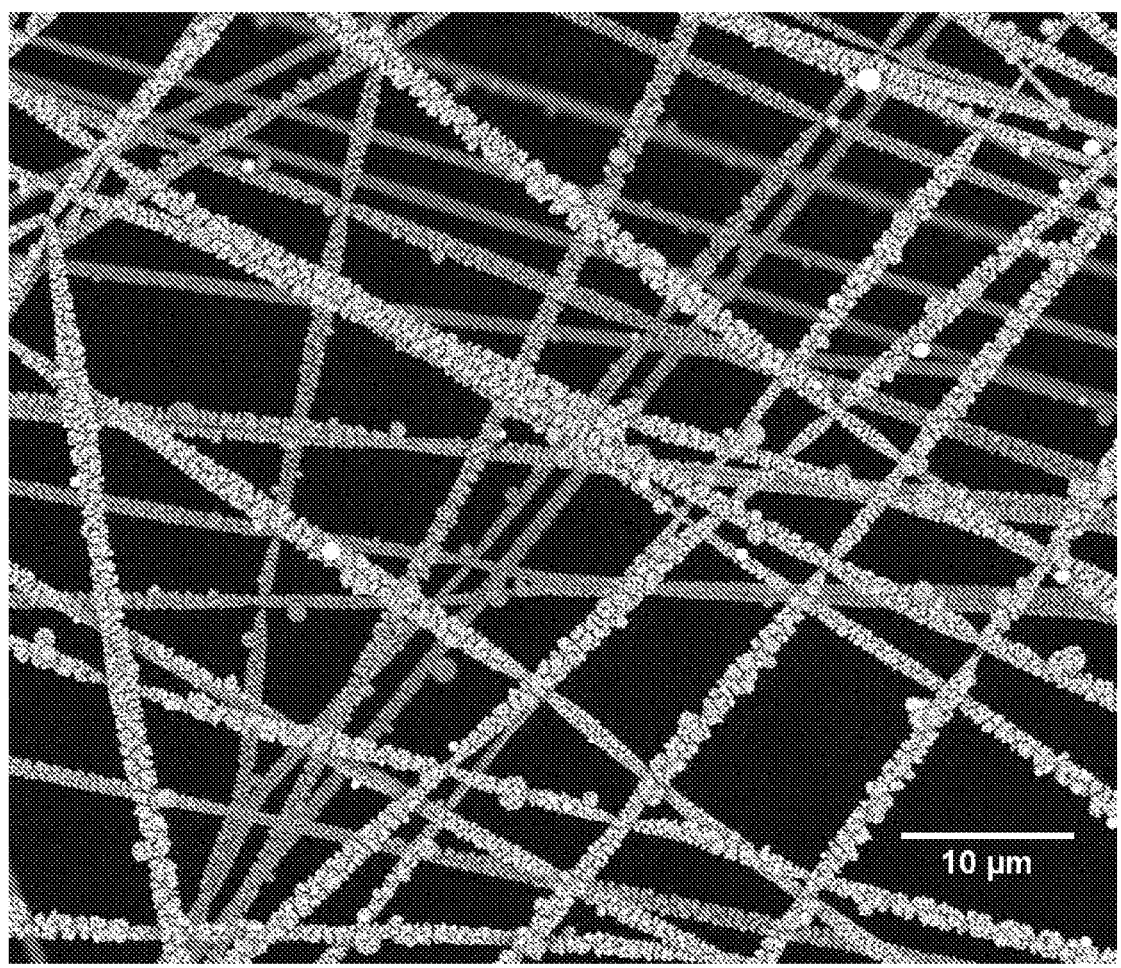
FIG. 3 shows a nanostructured material in accordance with a specific embodiment of the present invention.

A spark was generated between two gold electrodes at a repetition frequency of 900 Hz. The mean power consumed by the spark was 1 W. Using 4 $dm^3$/min of argon flow and a residence time of 47 ms between the spark and the porous carrier, nanoparticles were deposited during 4 hours on a 14 mm porous carrier consisting of polyvinyl alcohol (PVA) nanofibers with diameters of 50-200 nm supported on a steel mesh. An essentially isotropic nanoporous structure with a layer thickness of 2 µm was obtained (FIG. 3).

Example 2

Figure 4:
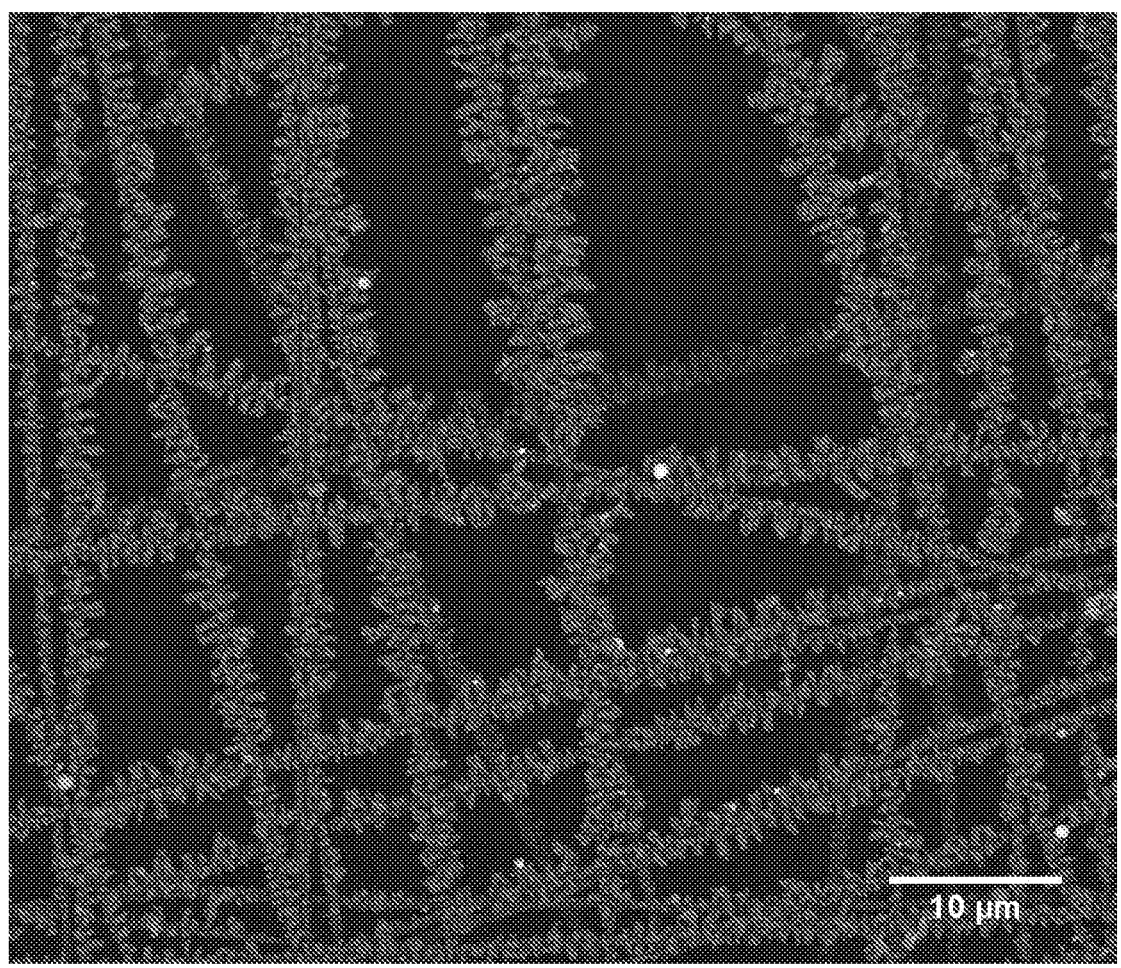
FIG. 4 shows another nanostructured material in accordance with a specific embodiment of the present invention.

A spark was generated between one gold and one aluminium electrode at a repetition frequency of 300 Hz. The mean power consumed by the spark was 1.5 W. Using 3 $dm^3$/min of argon and a residence time of 50 ms, nanoparticles were deposited during 2 hours on a 14 mm porous carrier consisting of PVA nanofibers with diameters of 50-200 nm supported on a steel mesh. Upon exposure to air, an essentially isotropic nanoporous structure comprising a mixture of $Al_2O_3$ and Au nanoparticles with a layer thickness of 1 µm was obtained (FIG. 4).

Example 3

Figure 5:
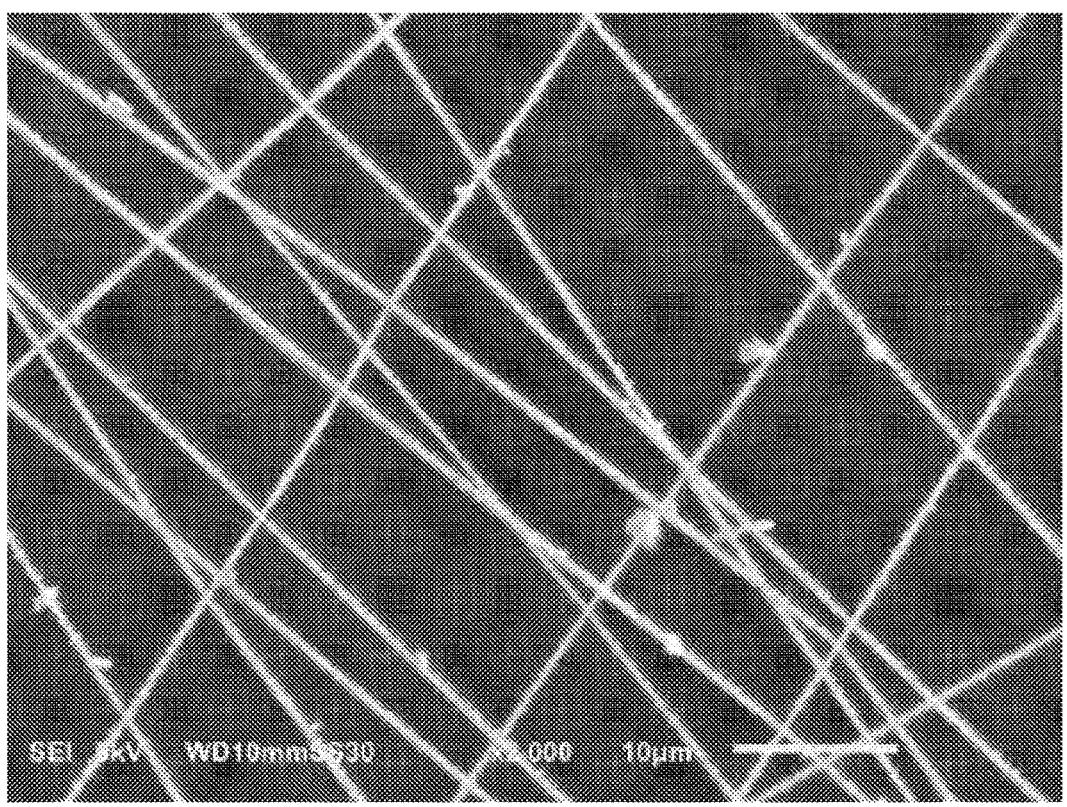
FIG. 5 shows yet another nanostructured material in accordance with a specific embodiment of the present invention.
Figure 6:
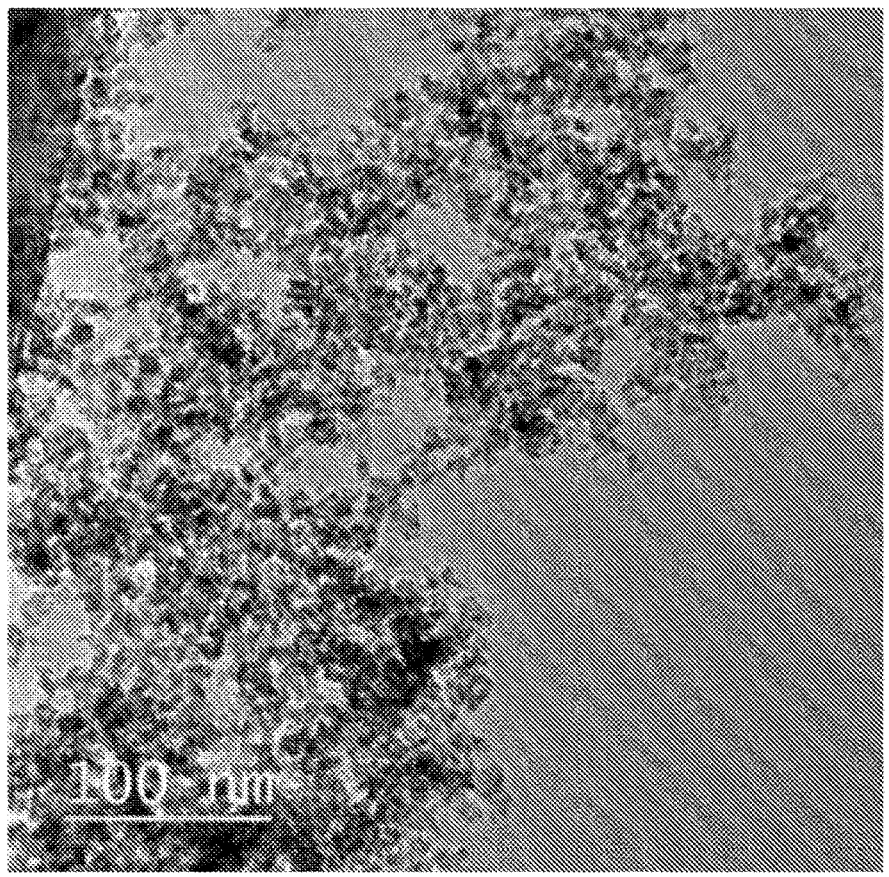
FIG. 6 shows the nanostructured material also shown in FIG. 5 at a smaller scale.

Sparks were generated between two aluminum electrodes at a repetition frequency of 1000 Hz. The mean power consumed by the spark was 3.5 W. Using a gas flow of 7 $dm^3$/min comprising 95% Ar and 5% $O_2$ and a residence time of 900 ms, nanoparticles were deposited during 25 minutes on a 14 mm porous carrier consisting of PVA nanofibers with diameters of 200-400 nm supported on a steel mesh. An essentially isotropic nanoporous structure of $Al_2O_3$ nanoparticles with a layer thickness of 0.5 µm was obtained (FIGS. 5 and 6).

Example 4

Figure 7:
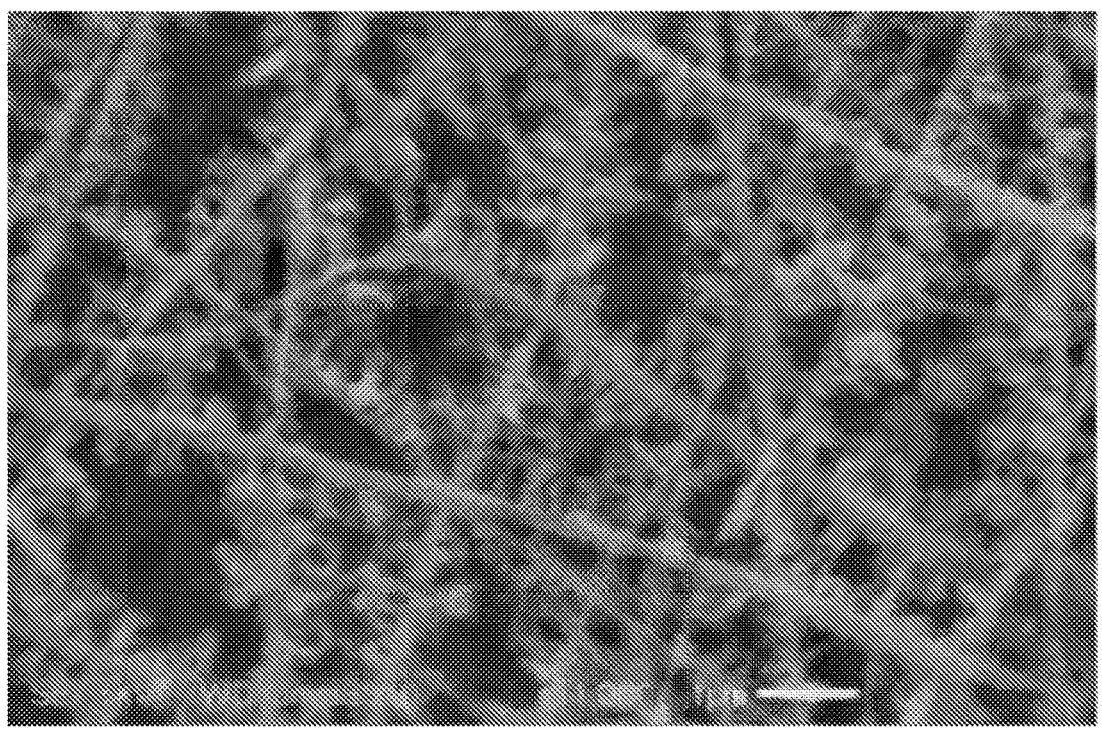
FIG. 7 shows yet another nanostructured material in accordance with a specific embodiment of the present invention.
Figure 8:
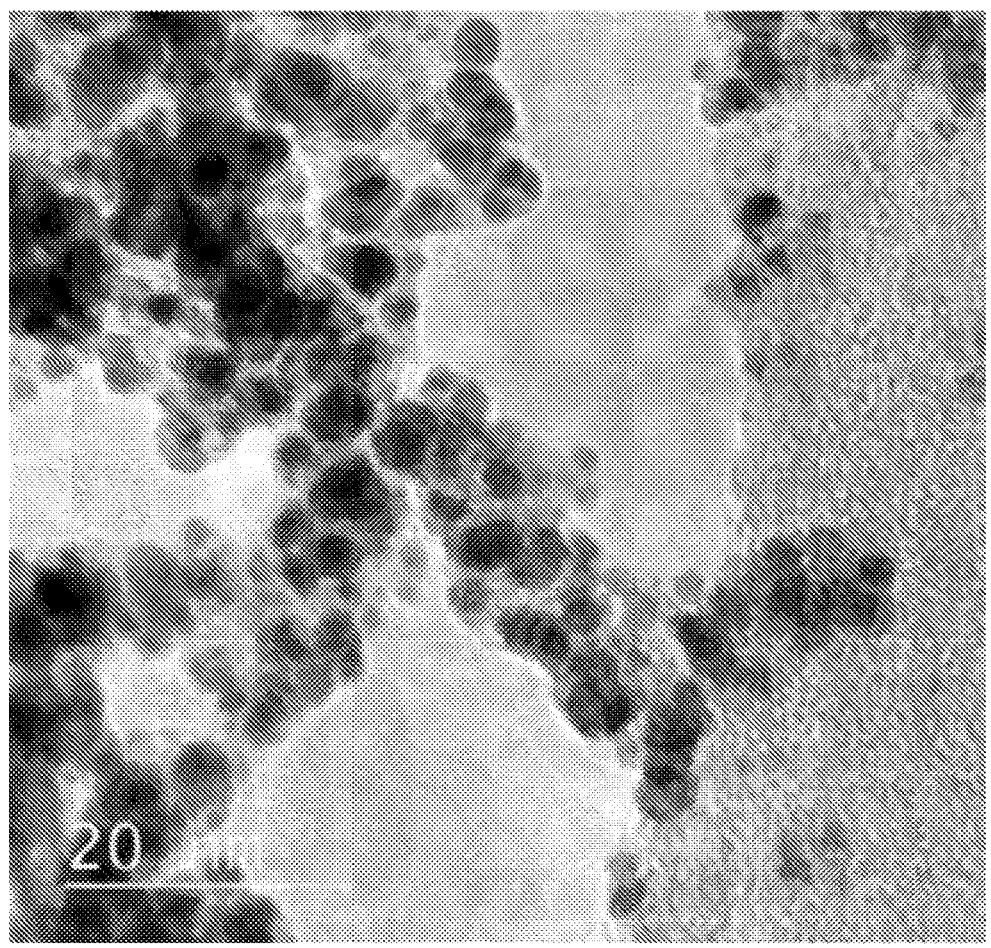
FIG. 8 shows the nanostructured material also shown in FIG. 7 at a smaller scale.

Sparks were generated between one titanium electrode and one gold electrode at a repetition frequency of 830 Hz. The mean power consumed by the spark was 3.75 W. Using a gas flow of 7 $dm^3$/min comprising 95% Ar and 5% $O_2$ and a residence time of 900 ms, nanoparticles were deposited during 25 minutes on a 14 mm porous carrier consisting of PVA nanofibers with diameters of 200-400 nm supported on a steel mesh. An essentially isotropic nanoporous structure of 5-10 nm titanium dioxide nanoparticles and 2-5 nm gold nanoparticles with a layer thickness of about 0.5 µm was obtained (FIGS. 7 and 8).

The invention claimed is:

1. A method for producing nanostructured material comprising the steps of:
   a) producing nanoparticles;
   b) transporting the nanoparticles into a porous carrier by a gas flow; and
   c) depositing the nanoparticles onto the surface of said porous carrier in a substantially isotropic manner, whereby the nanoparticles are evenly distributed on the external and internal surfaces of the porous carrier, and wherein the nanoparticles range in size from 1-100 nm thereby providing the nanostructured materials with a rough surface.

2. The method according to claim 1, wherein the nanoparticles are produced with a spark ablation device.

3. The method according to claim 1, wherein the nanoparticles are deposited onto the porous carrier by diffusion of the nanoparticles.

4. The method according to claim 1, wherein the porous carrier is a nanoporous carrier.

5. The method according to claim 1, wherein the size of the nanoparticles is less than the mean free path.

6. The method according to claim 1, wherein the nanoparticles are deposited in a time of less than 1000 ms after the production of the nanoparticles.

7. The method according to claim 1, wherein the nanoparticles are produced and deposited at atmospheric pressure.

8. The method according to claim 1, wherein after deposition of the nanoparticles onto the porous carrier, the porous carrier is removed from the nanoparticles.

9. The method according to claim 4, wherein the nanoporous carrier comprises nanowires.

10. The method according to claim 9, wherein the nanowires have a diameter of less than 1000 nm.

11. The method according to claim 10, wherein the nanowires have a diameter of less than 200 nm.

12. The method according to claim 9, wherein the nanowires have a diameter of less than the mean free path.

13. The method according to claim 5, wherein the size of the nanoparticles is less than 20 nm.

14. The method according to claim 13, wherein the size of the nanoparticles is less than 10 nm.

15. The method according to claim 6, wherein the nanoparticles are deposited in a time of less than 100 ms after the production of the nanoparticles.

16. The method according to claim 15, wherein the nanoparticles are deposited in a time of less than 20 ms after the production of the nanoparticles.

17. A method for producing nanostructured materials, comprising:
   a) producing nanoparticles;
   b) transporting the nanoparticles into a porous carrier having an external and an internal surface by a gas flow; and
   c) depositing the nanoparticles onto the surfaces of said porous carrier, whereby the thickness of the layers of deposited nanoparticles on the internal and external surfaces are the same;
   wherein the nanoparticles range in size from 1-100 nm thereby providing the nanostructured materials with a rough surface.

18. The method according to claim 1, wherein the nanostructured material comprises two or more types of nanoparticles formed from different materials.

19. The method according to claim 17, wherein the nanostructured material comprises two or more types of nanoparticles formed from different materials.

20. A method for producing nanostructured material comprising the steps of:
   a) producing nanoparticles by coagulation of vapor atoms;
   b) transporting the nanoparticles into a porous carrier by a gas flow; and
   c) depositing the nanoparticles onto the surface of said porous carrier in a substantially isotropic manner in a time of 10 ms or more after the vapor atoms are formed, whereby the nanoparticles are evenly distributed on the external and internal surfaces of the porous carrier, and wherein the nanoparticles range in size from 1-100 nm thereby providing the nanostructured materials with a rough surface.

* * * * *